(12) United States Patent
Zeidman

(10) Patent No.: US 8,160,863 B2
(45) Date of Patent: *Apr. 17, 2012

(54) SYSTEM AND METHOD FOR CONNECTING A LOGIC CIRCUIT SIMULATION TO A NETWORK

(75) Inventor: Robert M. Zeidman, Cupertino, CA (US)

(73) Assignee: Ionipas Transfer Company, LLC, Dover, DE (US)

( * ) Notice: Subject to any disclaimer, the term of this patent is extended or adjusted under 35 U.S.C. 154(b) by 1776 days.

This patent is subject to a terminal disclaimer.

(21) Appl. No.: 10/044,217

(22) Filed: Nov. 19, 2001

(65) Prior Publication Data

US 2002/0101824 A1 Aug. 1, 2002

Related U.S. Application Data

(63) Continuation-in-part of application No. 09/751,573, filed on Dec. 28, 2000, now Pat. No. 7,050,962.

(60) Provisional application No. 60/193,169, filed on Mar. 28, 2000.

(51) Int. Cl.
*G06F 9/455* (2006.01)

(52) U.S. Cl. .......... 703/24; 370/232; 370/352; 370/413; 370/353; 709/210; 709/250; 709/213; 709/218; 703/25; 703/27; 703/28

(58) Field of Classification Search ............ 703/15, 703/14, 17, 23; 706/25; 716/16, 4, 18; 714/4; 719/316; 709/223; 375/147; 713/190; 345/156; 715/855; 370/389, 249, 204, 498; 348/14.13, 348/14, 348/14.01

See application file for complete search history.

(56) References Cited

U.S. PATENT DOCUMENTS

| | | | | |
|---|---|---|---|---|
| 4,486,877 | A | * | 12/1984 | Turner .......................... 370/249 |
| 4,590,581 | A | | 5/1986 | Widdoes, Jr. |
| 4,635,218 | A | | 1/1987 | Widdoes, Jr. |
| 4,744,084 | A | | 5/1988 | Beck et al. |
| 4,907,225 | A | * | 3/1990 | Gulick et al. ................. 370/463 |
| 4,908,819 | A | * | 3/1990 | Casady et al. ............... 370/204 |
| 4,939,507 | A | * | 7/1990 | Beard et al. .................. 345/156 |
| 5,048,012 | A | * | 9/1991 | Gulick et al. ................. 370/498 |
| 5,272,728 | A | | 12/1993 | Ogawa |
| 5,280,481 | A | * | 1/1994 | Chang et al. .................. 370/352 |
| 5,299,313 | A | * | 3/1994 | Petersen et al. ............... 709/234 |
| 5,299,314 | A | * | 3/1994 | Gates .............................. 710/64 |
| 5,303,347 | A | * | 4/1994 | Gagne et al. .................. 711/119 |
| 5,307,459 | A | * | 4/1994 | Petersen et al. ............... 709/250 |
| 5,347,305 | A | * | 9/1994 | Bush et al. ................. 348/14.01 |

(Continued)

OTHER PUBLICATIONS

Wesley W. Chu and M. Y. Elsanadidi Simulation studies of the Behavior of Multihop Broadcast ACM, 0-89791-089-3/83/0300-0170, 1983, pp. 170-177.*

(Continued)

*Primary Examiner* — Kamini S Shah
*Assistant Examiner* — Cuong V Luu

(57) ABSTRACT

A system and method for connecting a running logic circuit simulation to a network running at a higher speed that includes a computer for receiving data packets from the network and storing the received data packets in a first buffer. The computer next transmits the received data packets to an electronic circuit in the logic circuit simulation at a slower speed. The computer also receives data packets from the electronic device under simulation, and stores the data packets received from the electronic device under simulation in a second buffer. The computer then transmits the data packets received from the electronic device under simulation to the network at a higher speed.

37 Claims, 8 Drawing Sheets

U.S. PATENT DOCUMENTS

| Patent No. | | Date | Inventor | Ref |
|---|---|---|---|---|
| 5,353,412 | A | 10/1994 | Douglas et al. | |
| 5,361,363 | A | 11/1994 | Wells et al. | |
| 5,477,531 | A * | 12/1995 | McKee et al. | 370/249 |
| 5,479,355 | A | 12/1995 | Hyduke | |
| 5,497,498 | A | 3/1996 | Taylor | |
| 5,539,452 | A * | 7/1996 | Bush et al. | 348/14.13 |
| 5,553,059 | A * | 9/1996 | Emerson et al. | 370/248 |
| 5,596,575 | A | 1/1997 | Yang et al. | |
| 5,659,684 | A * | 8/1997 | Giovannoni et al. | 709/250 |
| 5,663,900 | A * | 9/1997 | Bhandari et al. | 716/17 |
| 5,678,028 | A | 10/1997 | Bershteyn et al. | |
| 5,684,721 | A * | 11/1997 | Swoboda et al. | 703/23 |
| 5,734,858 | A | 3/1998 | Patrick et al. | |
| 5,740,448 | A * | 4/1998 | Gentry et al. | 710/200 |
| 5,748,806 | A | 5/1998 | Gates | |
| 5,748,875 | A | 5/1998 | Tzori | |
| 5,752,068 | A | 5/1998 | Gilbert | |
| 5,754,764 | A | 5/1998 | Davis et al. | |
| 5,761,486 | A * | 6/1998 | Watanabe et al. | 703/21 |
| 5,771,370 | A | 6/1998 | Klein | |
| 5,805,792 | A | 9/1998 | Swoboda et al. | |
| 5,822,520 | A | 10/1998 | Parker | |
| 5,838,919 | A * | 11/1998 | Schwaller et al. | 709/224 |
| 5,838,950 | A | 11/1998 | Young et al. | |
| 5,848,236 | A | 12/1998 | Dearth et al. | |
| 5,850,345 | A * | 12/1998 | Son | 703/17 |
| 5,857,109 | A | 1/1999 | Taylor | |
| 5,881,269 | A * | 3/1999 | Dobbelstein | 703/21 |
| 5,889,954 | A * | 3/1999 | Gessel et al. | 709/223 |
| 5,907,696 | A * | 5/1999 | Stilwell et al. | 703/13 |
| 5,911,059 | A * | 6/1999 | Profit, Jr. | 703/23 |
| 5,933,656 | A | 8/1999 | Hansen | |
| 5,938,732 | A | 8/1999 | Lim et al. | |
| 5,963,726 | A | 10/1999 | Rust et al. | |
| 6,014,651 | A * | 1/2000 | Crawford | 705/400 |
| 6,047,387 | A | 4/2000 | Chang et al. | |
| 6,061,767 | A * | 5/2000 | Kuo et al. | 711/156 |
| 6,067,585 | A * | 5/2000 | Hoang | 710/11 |
| 6,108,309 | A * | 8/2000 | Cohoe et al. | 370/241 |
| 6,128,673 | A * | 10/2000 | Aronson et al. | 710/22 |
| 6,141,689 | A | 10/2000 | Yasrebi | |
| 6,151,567 | A | 11/2000 | Ames et al. | |
| 6,173,377 | B1 * | 1/2001 | Yanai et al. | 711/162 |
| 6,202,044 | B1 | 3/2001 | Tzori | |
| 6,223,144 | B1 | 4/2001 | Barnett et al. | |
| 6,229,808 | B1 * | 5/2001 | Teich et al. | 370/398 |
| 6,230,114 | B1 | 5/2001 | Hellestrand et al. | |
| 6,243,833 | B1 | 6/2001 | Hitchcock et al. | |
| 6,263,302 | B1 | 7/2001 | Hellestrand et al. | |
| 6,279,122 | B1 | 8/2001 | Hitchcock et al. | |
| 6,279,146 | B1 * | 8/2001 | Evans et al. | 716/18 |
| 6,307,877 | B1 | 10/2001 | Philips et al. | |
| 6,324,492 | B1 | 11/2001 | Rowe | |
| 6,327,579 | B1 * | 12/2001 | Crawford | 705/400 |
| 6,333,940 | B1 * | 12/2001 | Baydar et al. | 370/506 |
| 6,345,242 | B1 | 2/2002 | Dearth et al. | |
| 6,347,388 | B1 | 2/2002 | Hollander | |
| 6,389,379 | B1 * | 5/2002 | Lin et al. | 703/14 |
| 6,405,145 | B1 | 6/2002 | Rust et al. | |
| 6,418,392 | B1 | 7/2002 | Rust et al. | |
| 6,536,029 | B1 | 3/2003 | Boggs et al. | |
| 6,560,641 | B1 | 5/2003 | Powderly et al. | |
| 6,563,796 | B1 | 5/2003 | Saito | |
| 6,563,816 | B1 * | 5/2003 | Nodoushani et al. | 370/352 |
| 6,571,205 | B1 | 5/2003 | Doucet et al. | |
| 6,584,436 | B2 * | 6/2003 | Hellestrand et al. | 703/13 |
| 6,597,727 | B2 * | 7/2003 | Philips et al. | 375/147 |
| 6,640,101 | B1 * | 10/2003 | Daniel | 455/423 |
| 6,691,301 | B2 | 2/2004 | Bowen | |
| 6,704,895 | B1 * | 3/2004 | Swoboda et al. | 714/726 |
| 6,751,583 | B1 * | 6/2004 | Clarke et al. | 703/17 |
| 6,757,367 | B1 * | 6/2004 | Nicol | 379/90.01 |
| 6,772,107 | B1 | 8/2004 | La Cascia, Jr. et al. | |
| 6,782,355 | B1 | 8/2004 | Cook et al. | |
| 6,785,873 | B1 * | 8/2004 | Tseng | 716/4 |
| 6,807,583 | B2 * | 10/2004 | Hrischuk et al. | 719/318 |
| 6,810,442 | B1 | 10/2004 | Lin et al. | |
| 6,850,510 | B2 * | 2/2005 | Kubler et al. | 370/338 |
| 6,850,577 | B2 * | 2/2005 | Li | 375/326 |
| 6,862,635 | B1 * | 3/2005 | Alverson et al. | 710/52 |
| 6,865,526 | B1 | 3/2005 | Henkel et al. | |
| 6,876,962 | B2 * | 4/2005 | Reblewski | 703/26 |
| 6,898,233 | B2 | 5/2005 | Philips et al. | |
| 6,904,110 | B2 * | 6/2005 | Trans et al. | 375/350 |
| 6,915,521 | B1 * | 7/2005 | Monteiro | 719/316 |
| 6,982,993 | B1 * | 1/2006 | Claveloux et al. | 370/503 |
| 7,050,962 | B2 * | 5/2006 | Zeidman | 703/24 |
| 7,076,418 | B1 | 7/2006 | Mayer | |
| 7,124,064 | B1 | 10/2006 | Thurston | |
| 7,200,544 | B1 | 4/2007 | McCown | |
| 7,209,470 | B2 | 4/2007 | McGowan | |
| 7,283,123 | B2 | 10/2007 | Braun et al. | |
| 2001/0038674 | A1 * | 11/2001 | Trans | 375/355 |
| 2001/0041566 | A1 * | 11/2001 | Xanthos et al. | 455/423 |
| 2001/0049594 | A1 * | 12/2001 | Klevans | 703/14 |
| 2002/0010881 | A1 | 1/2002 | White | |
| 2002/0019969 | A1 | 2/2002 | Hellestrand et al. | |
| 2002/0032559 | A1 | 3/2002 | Hellestrand et al. | |
| 2002/0056358 | A1 | 5/2002 | Ludwig | |
| 2002/0067757 | A1 | 6/2002 | Philips et al. | |
| 2002/0095224 | A1 | 7/2002 | Braun et al. | |
| 2002/0127525 | A1 | 9/2002 | Arington et al. | |
| 2002/0138244 | A1 | 9/2002 | Meyer | |
| 2002/0181633 | A1 * | 12/2002 | Trans | 375/354 |
| 2003/0033588 | A1 | 2/2003 | Alexander | |
| 2003/0033594 | A1 | 2/2003 | Bowen | |
| 2003/0040897 | A1 * | 2/2003 | Murphy et al. | 703/18 |
| 2003/0043753 | A1 * | 3/2003 | Nelson et al. | 370/249 |
| 2003/0086426 | A1 | 5/2003 | Vandeweerd et al. | |
| 2003/0093257 | A1 | 5/2003 | Cavanagh et al. | |
| 2003/0093569 | A1 | 5/2003 | Sivier et al. | |
| 2003/0101040 | A1 | 5/2003 | Nightingale | |
| 2003/0126195 | A1 | 7/2003 | Reynolds et al. | |
| 2003/0137528 | A1 | 7/2003 | Wasserman et al. | |
| 2003/0225556 | A1 | 12/2003 | Zeidman | |
| 2003/0225564 | A1 | 12/2003 | Zeidman | |
| 2004/0034719 | A1 | 2/2004 | Peterson et al. | |
| 2004/0095398 | A1 * | 5/2004 | Muratori et al. | 345/855 |
| 2004/0143655 | A1 * | 7/2004 | Narad et al. | 709/223 |
| 2004/0148610 | A1 * | 7/2004 | Tsun et al. | 719/316 |
| 2004/0208293 | A1 * | 10/2004 | Mohammadian et al. | 379/21 |
| 2005/0026649 | A1 * | 2/2005 | Zicker et al. | 455/552.1 |
| 2005/0102125 | A1 | 5/2005 | Tseng | |
| 2006/0059387 | A1 | 3/2006 | Swoboda et al. | |
| 2006/0179427 | A1 | 8/2006 | Underseth et al. | |
| 2006/0259949 | A1 * | 11/2006 | Schaefer et al. | 726/1 |
| 2007/0061127 | A1 | 3/2007 | Zeidman | |
| 2007/0064694 | A1 | 3/2007 | Ziedman | |
| 2007/0067151 | A1 | 3/2007 | Fiedler et al. | |
| 2007/0100598 | A1 | 5/2007 | Zeidman | |
| 2008/0058005 | A1 * | 3/2008 | Zicker et al. | 455/552.1 |

OTHER PUBLICATIONS

Larkshman the Performance of TCP/IP for Network with High Bandwidth-Delay Procducts and Random Loss IEEE/ACM Transaction on Networking vol. 5, No. 3, Jun. 1997, pp. 336-350.*

Microsoft Press Computer Dictionary Microsoft Press, third Edition, 1997, pp. 179-180.*

D. Helmy, B. Pagurek, A.R. Kaye Knowledge Based Fault Location in a Data Communication Network CH2538-7/88/0000-1729, IEEE.*

Mark Hill, Shubhendu Mukherjee The Impact of Data Transfer and Buffering Alternatives on Network Interface Design Proceedings of the Fourth International Symposium on High-Performance Computer Architecture, Feb. 1998.*

Lee A Hardware-Software Co-Simulation Environment University of California at Berkeley, 1993.*

Microsoft Corporation, *"Direct Cable Connection, Using Direct Cable Connection to Connect to Another Computer"*; 2000©; 2 pages.

Laplink 2000, "www.laplink.com", "Complete Access to Your PC From Anywhere"; 2 pages.

Chen et al; "On the Design of a High-Performance ATM Bridge", IEEE, 1998, pp. 207-213.

Dean et al; A High-Temperature Embedded Network Interface Using Software Thread Integration; Second International Workshop on Compiler and Architecture Support for Embedded Systems, Oct. 1-3, 1999.

Official Action issued for U.S. Appl. No. 09/751,573 on Jul. 30, 2004; 10 pages.

Response to Official Action issued for U.S. Appl. No. 09/751,573 on Jul. 30, 2004; 12 pages filed on Aug. 31, 2004.

Official Action issued for U.S. Appl. No. 09/751,573 on Jan. 3, 2005; 12 pages.

Response to Official Action issued for U.S. Appl. No. 09/751,573 on Jan. 3, 2005; 18 pages filed on Feb. 24, 2005.

Advisory Action issued for U.S. Appl. No. 09/751,573 on Apr. 11, 2005; 3 pages.

Appeal filed in U.S. Appl. No. 09/751,573 on May 24 2005; 28 pages.

Notice of Allowance issued for U.S. Appl. No. 09/751,573 on Aug. 12, 2005; 3 pages.

Official Action issued for U.S. Appl. No. 10/158,648 on Oct. 5, 2005; 15 pages.

Response to Official Action issued for U.S. Appl. No. 10/158,648 on Oct. 5, 2005; 24 pages filed on Dec. 19, 2005.

Official Action issued for U.S. Appl. No. 10/158,648 on Apr. 10, 2006; 14 pages.

Response to Official Action issued for U.S. Appl. No. 10/158,648 on Apr. 10, 2006; 25 pages filed on Jun. 26, 2006.

Official Action issued for U.S. Appl. No. 10/158,648 on Dec. 4, 2006; 5 pages.

Pre-Appeal Brief Request for Review filed in U.S. Appl. No. 10/158,648 on Feb. 27, 2007; 6 pages.

Notice of Panel Decision from Pre-Appeal Brief Review issued for U.S. Appl. No. 10/158,648 on Mar. 13, 2007; 2 pages.

Notice of Allowance issued for U.S. Appl. No. 10/158,648 on Jun. 27, 2007; 17 pages.

Amendment filed in U.S. Appl. No. 10/158,648 on May 25, 2007; 25 pages.

Notice of Allowance issued for U.S. Appl. No. 10/158,648 on Aug. 8, 2007; 3 pages.

Official Action issued for U.S. Appl. No. 10/158,772 on Dec. 19, 2005; 18 pages.

Response to Official Action issued for U.S. Appl. No. 10/158,772 on Dec. 19, 2005; 23 pages filed on Feb. 7, 2006.

Official Action issued for U.S. Appl. No. 10/158,772 on May 22, 2006; 12 pages.

Response to Official Action issued for U.S. Appl. No. 10/158,772 on May 22, 2006; 23 pages filed on Sep. 20, 2006.

Official Action issued for U.S. Appl. No. 10/158,772 on Nov. 29, 2006; 17 pages.

Response to Official Action issued for U.S. Appl. No. 10/158,772 on Nov. 29, 2006; 25 pages filed on Jan. 26, 2007.

Advisory Action issued for U.S. Appl. No. 10/158,772 on Feb. 14, 2007; 3 pages.

Pre-Appeal Brief Request for Review filed in U.S. Appl. No. 10/158,772 on Feb. 27, 2007; 6 pages.

Notice of Panel Decision from Pre-Appeal Brief Review issued in U.S. Appl. No. 10/158,772 on Mar. 9, 2007; 2 pages.

Appeal Brief filed in U.S. Appl. No. 10/158,772 on Apr. 27, 2007; 36 pages.

Amended Appeal Brief filed in U.S. Appl. No. 10/158,772 on Jul. 3, 2007; 37 pages.

Examiner's Answer issued in U.S. Appl. No. 10/158,772 on Sep. 21, 2007; 23 pages.

Reply Brief filed in U.S. Appl. No. 10/158,772 on Oct. 16, 2007; 17 pages.

Official Action issued in U.S. Appl. No. 11/557,053 on Apr. 4, 2008; 14 pages.

Response to Official Action issued in U.S. Appl. No. 11/557,053 on Apr. 4, 2008; 10 pages filed on Oct. 3, 2008.

Official Action issued in U.S. Appl. No. 11/557,053 on Nov. 25, 2008; 15 pages.

Response to Official Action issued in U.S. Appl. No. 11/557,053 on Nov. 25, 2008; 9 pages filed on Feb. 20, 2009.

Official Action issued in U.S. Appl. No. 11/557,057 on Jul. 28, 2008; 14 pages.

Response to Official Action issued in U.S. Appl. No. 11/557,057 on Jul. 28, 2008; 16 pages. filed Dec. 29, 2008.

Official Action issued in U.S. Appl. No. 11/557,064 on Jul. 27, 2007; 20 pages.

Response to Official Action issued in U.S. Appl. No. 11/557,064 on Jul. 27, 2007; 24 pages filed Sep. 19, 2007.

Official Action issued in U.S. Appl. No. 11/557,064 on Oct. 19, 2007; 20 pages.

Response to Official Action issued in U.S. Appl. No. 11/557,064 on Oct. 19, 2007; 11 pages filed on Dec. 12, 2007.

Official Action issued in U.S. Appl. No. 11/557,064 on Jan. 15, 2008; 40 pages.

Response to Official Action issued in U.S. Appl. No. 11/557,064 on Jan. 15, 2008; 14 pages filed on May 15, 2008.

Official Action issued in U.S. Appl. No. 11/557,064 on Oct. 14, 2008; 18 pages.

Response to Official Action issued in U.S. Appl. No. 11/557,064 on Oct. 14, 2008; 18 pages filed on Jan. 14, 2009.

Official Action in U.S. Appl. No. 12/946,721 issued Jul. 20, 2011, 11 pages.

Response to Office Action in U.S. Appl. No. 12/946,721 issued Jul. 20, 2011, mailed Oct. 19, 2011, 10 pages.

* cited by examiner

SYSTEM AND METHOD FOR CONNECTING A LOGIC CIRCUIT SIMULATION TO A NETWORK

CROSS-REFERENCE TO RELATED PATENT APPLICATION

The present application is a continuation-in-part application of copending U.S. patent application, entitled "METHOD FOR CONNECTING A HARDWARE EMULATOR TO A NETWORK," Ser. No. 09/751,573, filed on Dec. 28, 2000.

BACKGROUND OF THE INVENTION

Prior to reducing an integrated circuit design to a form suitable for fabrication, the integrated circuit design is often simulated in software on a computer, and emulated in hardware to allow the design to be optimized and debugged. Typically, using a hardware description language (e.g., VHDL), the circuit designer prepares a hardware description of the integrated circuit, which is then compiled into a software model to be simulated on a computer (e.g., an engineering workstation). Often, the hardware description can also be compiled into a hardware model that can be emulated in a hardware emulator. A hardware emulator suitable for such use typically includes field programmable gate arrays (FPGAs) that serve as a breadboard for implementing the integrated circuit design. Both the simulation and the emulator typically run at a slower speed than a computer network (e.g., an Ethernet network).

When an integrated circuit that has a computer network interface is simulated or emulated, network activities are usually simulated or emulated at the speed of the circuit emulator or the circuit simulation. When using a circuit emulator, a conventional network-emulation device is typically connected to a port of the circuit emulator. The circuit emulator receives data packets from the network-emulation device, re-packages the data and transmits the re-packaged data back at the speed of the circuit emulator. The re-packaged data is then received by the network-emulation device, which inspects the re-packaged data to determine if the integrated circuit under emulation in the circuit emulator correctly sends and receives data packets. However, on balance, such a conventional network-emulation device does not emulate network behavior accurately and correctly.

Alternatively, another conventional technique for connecting a circuit emulator to the network requires slowing down the network, receiving signals from the slowed network and translating the signals into suitable electrical signals in the form that the circuit emulator can accept. The circuit emulator, which typically operates at a slower speed than the network, can also send packets to the slowed network. However, because the network is designed to operate at a different speed, timing issues may arise in such a slowed network. These timing issues may require further modification to the network to resolve. Such modifications are undesirable because the modified network may not adequately represent network characteristics. Because not all network devices can be slowed to the circuit emulator speed, the circuit emulator is typically also limited to communication with a small subset of devices on the network.

Shortcomings of an emulation are typically also present in a logic circuit simulation.

SUMMARY OF THE INVENTION

The present invention allows a logic circuit simulator ("circuit simulation") running on a host processor to connect to a computer network at full network speed. The present invention provides a method and an apparatus for transferring data packets between a circuit simulation and the network. In one embodiment, an interface software program also installed on a host computer (e.g., a personal computer) is provided to handle communication between the network and the circuit simulator. The network can be, for example, an Ethernet network.

According to the present invention, data packets addressed to a device under simulation, or alternatively, addressed to a workstation connected to the network through the circuit simulation, is received and stored in buffers of the host computer. (In one example, a workstation is connected to a network through a simulated network interface.) The interface software in the host computer repackages the data packet into a second format for transmission to the simulated device at the speed of the circuit simulation. Under this arrangement, the interface software in the host computer need not send to the circuit simulation, for example, the preamble required to synchronize the clocks of the network and the circuit simulation, because the circuit simulation is usually not capable of providing an analog interface required to respond to the preamble. Similarly, the interface software in the host computer repackages the data packets received from the circuit simulation into proper format for transmission to the network at full network speed. Under this arrangement, the existing memory in the host computer is used to buffer data packets communicated between the circuit simulation and the network, so that data packets received from the network at network speed are transmitted to the circuit simulation at a slower speed, and data packets received from the circuit simulation at the slower speed is provided to the network at full network speed.

In one embodiment, the present invention allows the interface software of a host computer to individually examine a data packet of a conventional off-the-shelf interface card to identify the beginning and the end of the packet. When the beginning and the end of a data packet can be identified, the interface software of the host computer ignores data packets not addressed to the simulated circuit. Consequently, compared to the prior art, a much smaller amount of buffer memory is required. This arrangement loses data packets only in the occasional event of a buffer overflow, thus effectively preventing network connection loss.

In one embodiment, the interface software of the host computer is implemented as a multithreaded program having, in one instance, two executing threads. One thread is a task that receives data packets from the network interface card, stores the received data packets in a buffer, retrieves the stored data for repackaging, and sends the repackaged data over a simulation interface to the circuit simulation. Another thread is a task that receives packets from the simulation interface, repackages the data into a network data packet and sends the network data packet over the network interface card to the network.

In another embodiment, the interface software of the host computer is implemented as a multithread program including four executing threads. One thread is a task that receives data packets from the network, and stores the received data packets in a buffer. A second thread is a task that polls the buffer for the received data packets. This second thread repackages the data packets and sends the repackaged packets over the simulation interface to the circuit simulation. A third thread is a task that receives data packets from the circuit simulation over the simulation interface and stores the received packets in a second buffer. A fourth thread is a task that polls the second buffer for the data packets received from the circuit simulation. This fourth thread repackages these data packets and sends the repackaged packets over the network interface to the network.

In yet another embodiment, the interface software of the host computer is also implemented as a multithread program, as in the previous embodiment, except that the second buffer is eliminated and the third and fourth tasks are combined into a single task executing as a single thread. In this embodiment, the single task receives data packets from the simulation interface from the circuit simulation, repackages the data packets received and sends the repackaged packets over the network interface to the network. This approach is possible because a circuit simulation runs at a much slower speed than the network, such that a data packet received from the circuit simulation can be repackaged and sent to the network before the next data packet's arrival from the circuit simulation.

Further features and advantages of various embodiments of the invention are described in the detailed description below, which is given by way of example only.

BRIEF DESCRIPTION OF THE DRAWINGS

In the following detailed description, to simplify the description, like elements are provided like reference numerals.

DETAILED DESCRIPTION

Figure 1:
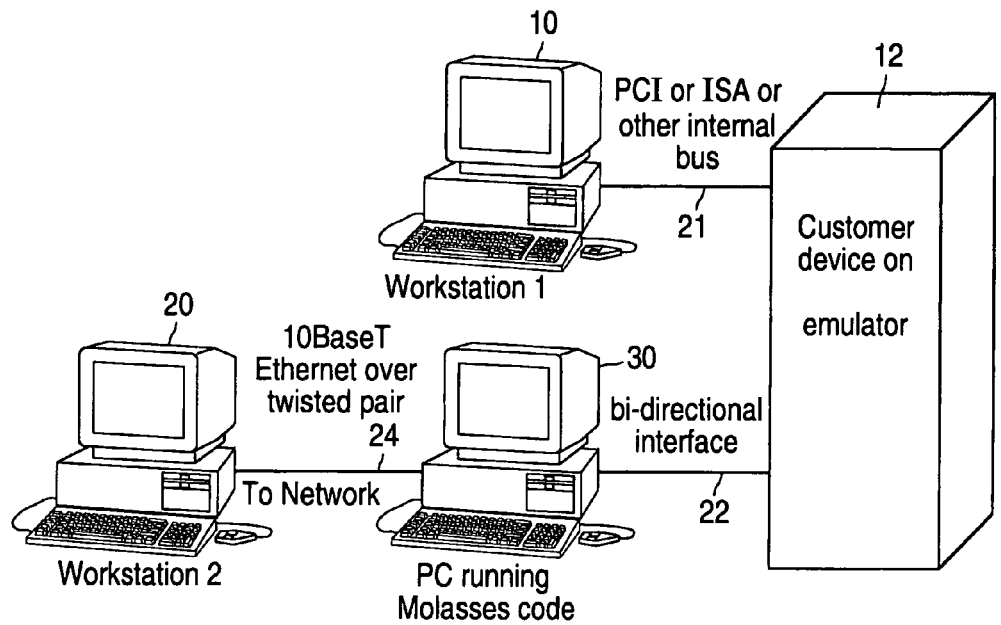
FIG. 1 shows a configuration including first workstation 10, second workstation 20, host computer 30 and circuit emulator 12, in accordance with the present invention.

The present invention is illustrated in the following using first, as an example, an emulation of a network interface device. At a latter part of this description, the present invention is illustrated, by way of another example, a simulation of a network interface device. FIG. 1 shows a configuration including first workstation 10, second workstation 20, host computer 30 and circuit emulator 12. In this embodiment, a network interface card is emulated in circuit emulator 12, which interfaces with first workstation 10 over a conventional internal bus (e.g., a PCI bus). The network interface card emulated is intended to operate as a network interface of a workstation, such as workstation 10. However, circuit emulator 12 does not operate at the full network speed the network interface card is intended. Circuit emulator 12 is connected to host computer 30 over bidirectional interface 22, such as a conventional personal computer (PC) parallel port. Host computer 30 runs an interface program "Molasses" which is discussed in further detail below in conjunction with FIG. 4. Host computer 30 connects to conventional computer network 24 (e.g., 10BaseT Ethernet over twisted pair) using a conventional network interface. Workstation 20 communicates with host computer 30 over computer network 24 using conventional network protocols. Host computer 30 can be, for example, a desktop PC running Windows 95 or Windows 98 and equipped with a 10baseT Ethernet controller card and two parallel ports. A proprietary parallel port interface can be used for faster transfer speeds or easier connection to circuit emulator 12. In one embodiment, host computer 30 includes an Intel Pentium class processor and is equipped with 32 Mbytes of DRAM and 500 Mbytes of hard disk space. Host computer 30 also includes Media Access Controller ("MAC") drivers, parallel port drivers and the NDIS API (Network Driver Interface Specification—Application Program Interface). MAC drivers interface the operating system to the Ethernet card hardware. The parallel port drivers allow the operating system to interact with the parallel port hardware, and the NDIS API allows functional enhancements to network drivers in the operating system. Host computer 30 also includes a Graphical Users Interface ("GUI") and a packet capture, buffering and transmission application program as part of the "Molasses" program, which will be described in further detail later. Workstations 10 and 20 can each be any conventional workstation, including a PC running the Windows 98 operating system.

Alternatively, the network interface card can also be simulated in a circuit simulation running on host computer 30. Host computer 30 also runs a version of the interface program "Molasses" (e.g., Molasses program 750 or 850) which is discussed in further detail below in conjunction with FIG. 7 or FIG. 8.

Figure 2:
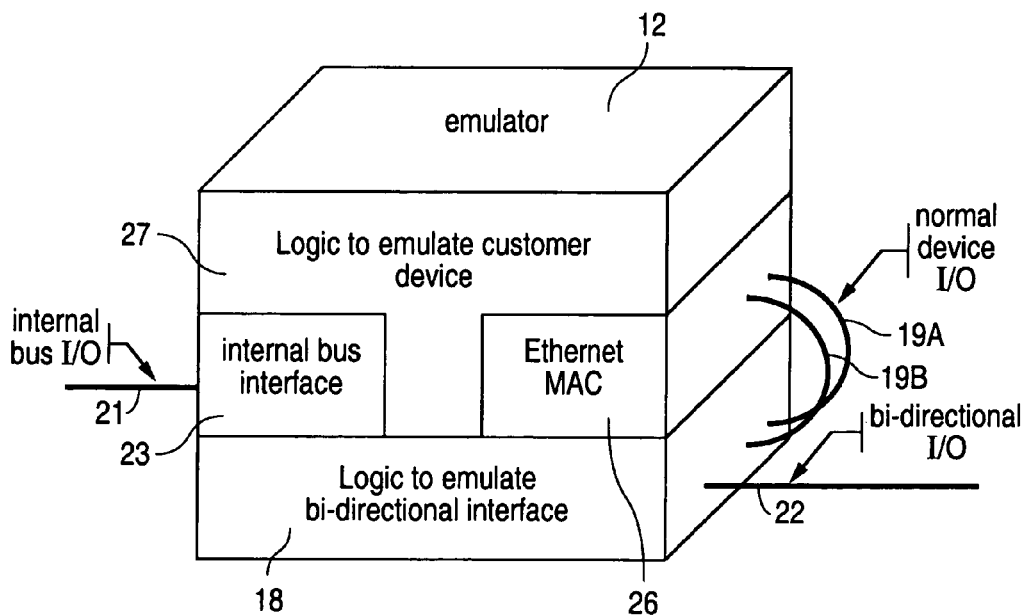
FIG. 2 is a block diagram showing one configuration of circuit emulator 12, during an emulation of a network interface card.

FIG. 2 is a block diagram of one configuration of circuit emulator 12 during an emulation of the network interface card. As shown in FIG. 2, circuit emulator 12 provides logic circuit 18 that couples circuit emulator 12's circuit to bi-directional interface 22, an emulated Ethernet MAC 26, interface 23 to internal bus 21, and logic circuit 27, which is the remainder of the emulated network interface card. Cable assemblies 19A and 19B connect the input terminals and the output terminals ("I/O terminals") of Ethernet MAC 26 and logic circuit 18. Logic circuit 18 translates the signals of Ethernet MAC 26 (communicated over cable assemblies 19A) into the signals of bi-directional interface 22 for transmitting to host computer 30. In one embodiment, computer network 24 includes a conventional hub providing 10baseT connections. Alternatively, computer network 24 can also include a switch, which selectively transmits data packet based on destination addresses. Use of a switch can reduce packet traffic at a particular connection, and thus reduce the buffer requirements at the connected devices (e.g., host computer 30). Providing a switch at host computer 30's connection to computer network 24 also simplifies the Molasses program 50 running on host computer 30. In this configuration, emulator 12's connection to workstation 10 over internal bus 21 allows examination of signals in logic circuits 18 and 27 for debugging purpose.

Figure 3:
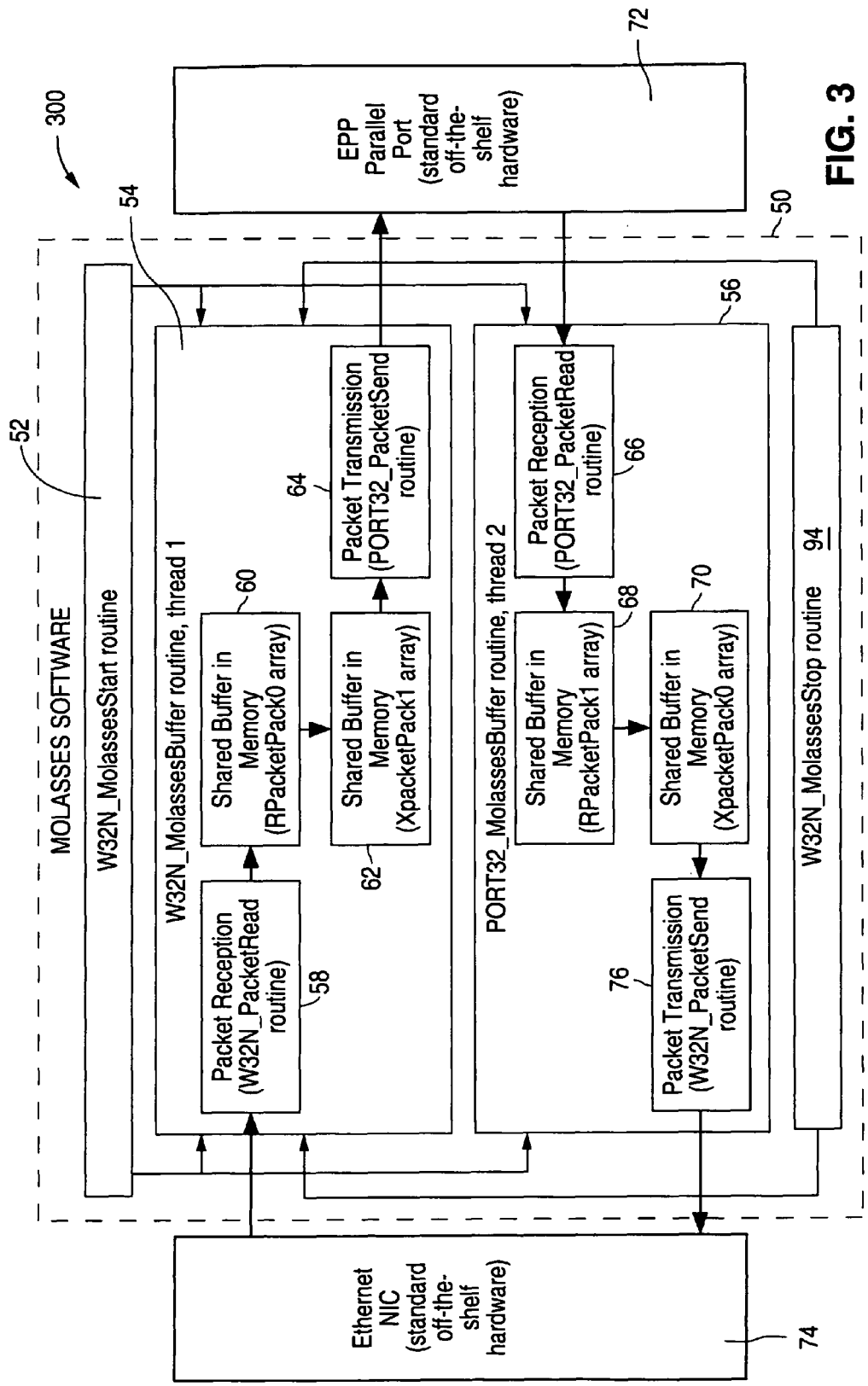
FIG. 3 is a block diagram 300 showing the functions performed by Molasses program 50, in accordance with one embodiment of the present invention.
Figure 4:
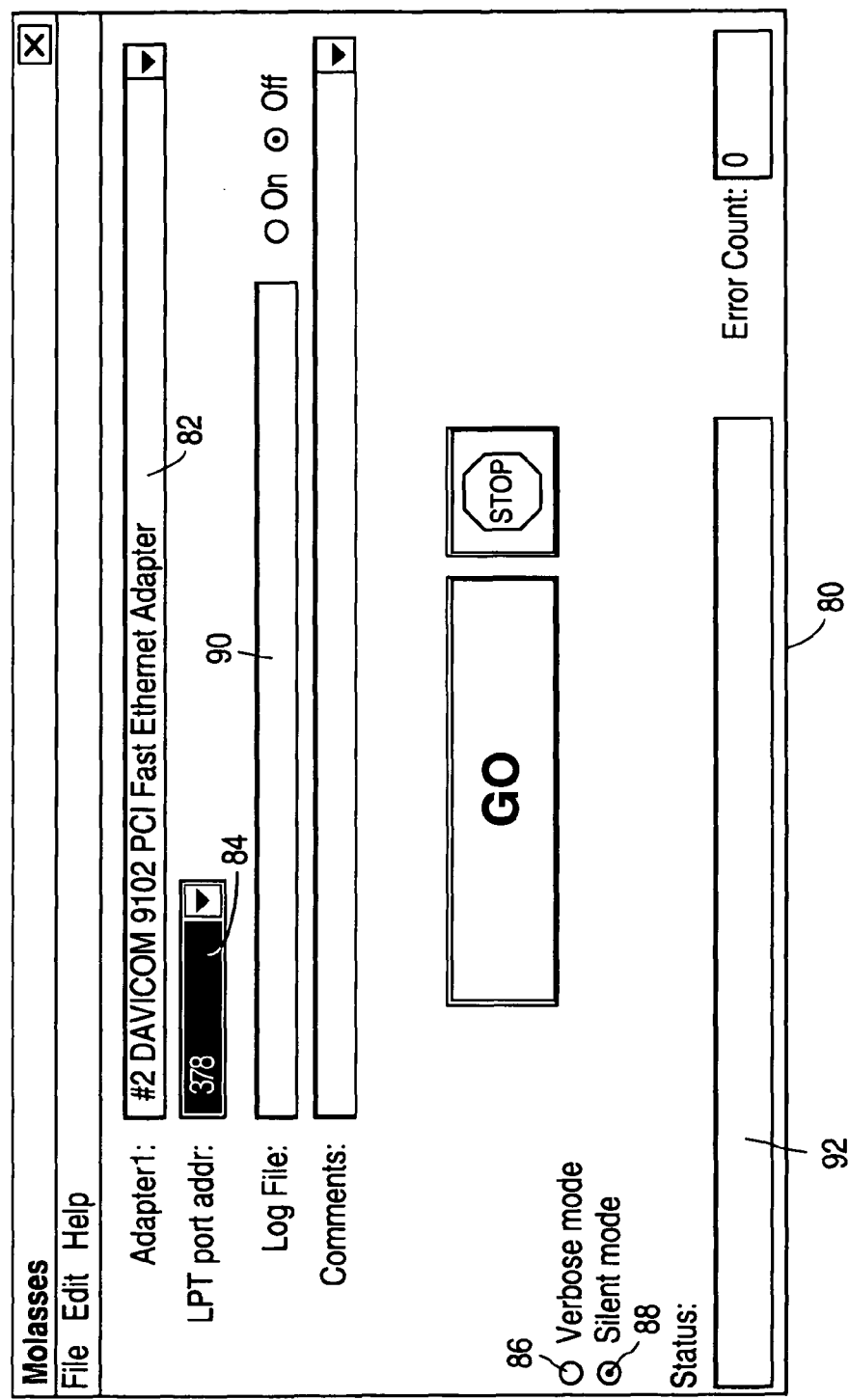
FIG. 4 shows a user interface Mainscreen 80 in Molasses program 50.

FIG. 3 is a block diagram 300 showing the functions performed by Molasses program 50, in accordance with one embodiment of the present invention. Molasses program 50 includes a graphical user interface illustrated in FIG. 4 by Mainscreen 80. As shown in FIG. 4, Mainscreen 80 allows the user to specify an Ethernet NIC (act 82) and a port address for bi-directional interface 22 connected to emulator 12 (act 84). Status line 92 displays continuously information about packets being processed by Molasses program 50. The amount of information to be shown on status line 92 can be selected using verbose mode option 86 and silent mode option 88. The user can also specify a log file (act 90) to record information such as the value of each byte in each data packet, a count or the nature of errors that occur, or comments that the user may wish to add. The log file can be used for future reference and debugging purposes.

Referring back to FIG. 3, Molasses program 50 interfaces with network interface card (NIC) 74, which provides host computer 30's access to computer network 24, and interface 72, which couples host computer 30 through bi-directional interface 22 to circuit emulator 12. In this embodiment, interface 72 can be a conventional parallel port operating under the conventional EPP standard. Once the parameters of Mainscreen 80 are set, Mainscreen 80 calls "W32N_MolassesStart" routine 52. Routine 52 creates simultaneous threads running "W32N_MolassesBuffer" routine 54 and "PORT32_MolassesBuffer" routine 56, respectively. W32N_MolassesBuffer routine 54 receives packets from the Ethernet NIC 74 (via a W32N_PacketRead routine 58), stores the received packets into receive buffer 60 ("RPacketPack0") in host computer 30's main memory. Subsequently, the received packets in buffer 60 are transferred to transmit buffer 62 ("XPacketPack1"), from which they are then transmitted to interface 72 via "PORT32_PacketSend" routine 64. PORT32_MolassesBuffer routine 56 receives packets from interface 72 (via "PORT32_PacketRead" routine 66), stores the packets into receive buffer 68 ("RPacketPack1"). Subsequently, routine 56 then transfers the data packets in buffer 68 to a transmit buffer 70 ("XPacketPack0"), which are then transmitted to the Ethernet NIC 74 via "W32N_PacketSend" routine 76. Molasses program 50 converts data packet formats, when necessary. For example, the preamble that is used in a packet for synchronizing the clock signals of the network and the emulated device is removed before being forwarded to circuit emulator 12 over interface 72.

Mainscreen 80 calls "W32N_MolassesStop" routine 94 to terminate execution of both threads 54 and 56.

Figure 6:
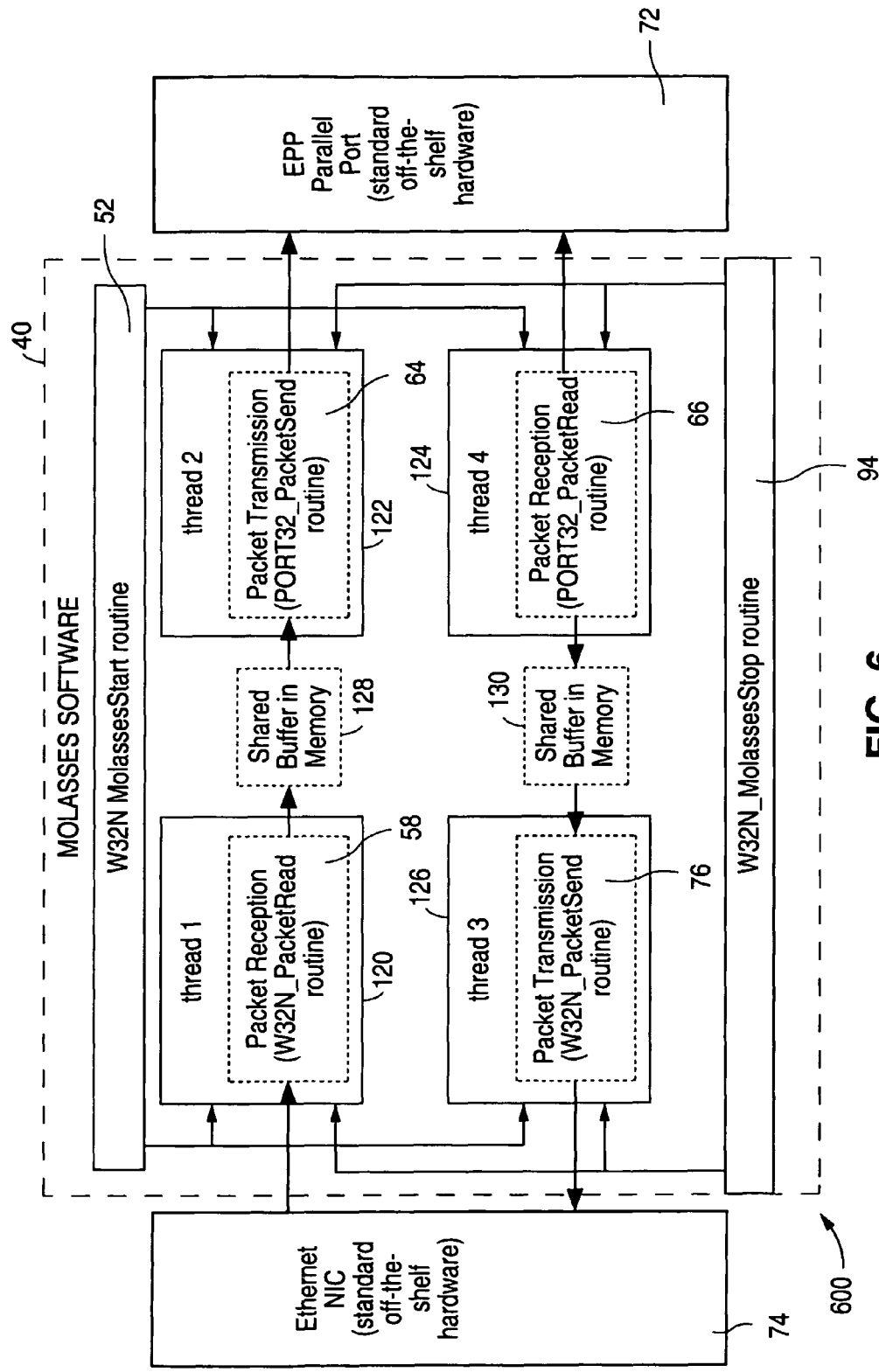
FIG. 6 is a block diagram 600 showing the functions performed by Molasses program 40, in accordance with a second embodiment of the present invention.

FIG. 6 is a block diagram 600 showing the functions performed by Molasses program 40, in accordance with a second embodiment of the present invention. As in Molasses program 50 of FIG. 3, Molasses program 40 of FIG. 6 interfaces with network interface 74, which provides host computer 30's access to computer network 24, and interface 72, which couples host computer 30 to bi-directional interface 22 to circuit emulator 12. Interface 72 can be implemented by a conventional parallel port operating under, for example, the EPP standard. Once the parameters of Mainscreen 80 (FIG. 4) are set, Mainscreen 80 calls "W32N_MolassesStart" routine 52, which creates four threads 120, 122, 124 and 126. Thread 120 executes "W32_PacketRead" routine 58, which receives data packets from Ethernet NIC 74 and stores the received data packet into shared buffer 128 in the main memory of the host computer 30. Thread 122 executes "Port32_PacketSend" routine 64, which polls shared buffer 128 for the received data packets, repackages these data packets and sends them to circuit emulator 12 over emulation interface (parallel port) 72. Thread 124 executes "Port32_PacketRead" routine 66, which receives data packets from circuit emulator 12 over parallel port 72 and stores the received data packet into shared buffer 130. Thread 126 executes a "W32N_PacketSend" routine 76, which polls shared buffer 130 for data packets, repackages the data packets and sends them into network 24 over Ethernet NIC 74.

Because circuit emulator 12 typically runs at a speed much slower than devices on network 24, an alternative embodiment combines threads 124 and 126 and eliminates shared buffer 130, taking advantage that W32N_PacketSend routine 76 can complete repackaging and sending out a data packet to network 24 before arrival of the next data packet from circuit emulator 12 over parallel port 72.

Mainscreen 80 calls "W32N_MolassesStop" routine 94 to terminate execution of both threads 120, 122, 124 and 126.

The size of each of buffers 60, 62, 68 and 70, 128 and 130 can be changed dynamically. Even then, a buffer overflow condition can occasionally occur, resulting in data packets being discarded. Typically, discarding an incomplete packet risks losing a network connection. However, there is no risk of losing a network connection under the present invention, because only whole packets are discarded.

Figure 9:
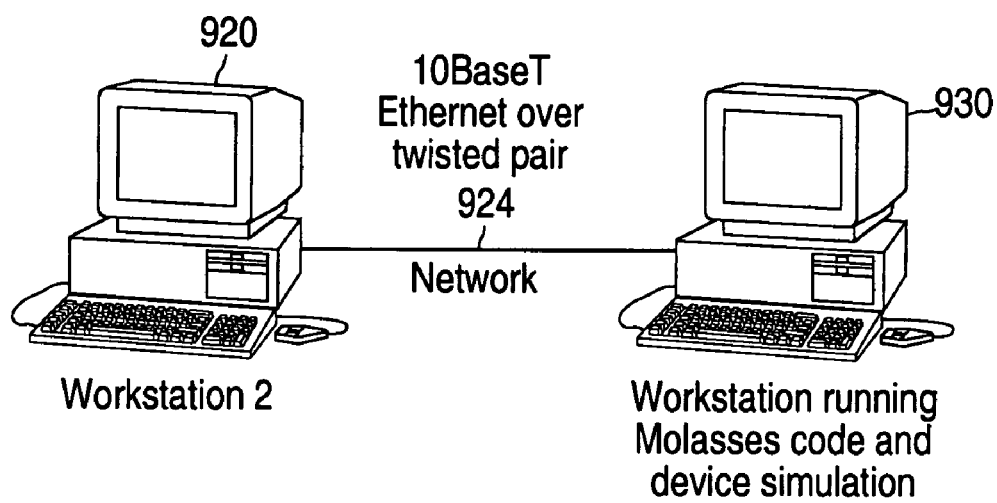
FIG. 9 shows a configuration including first workstation 920 and host computer 930.

As mentioned above, the present invention is also applicable to a circuit simulation of the network interface device. FIG. 9 shows a configuration including first workstation 920 and host computer 930. In this embodiment, a network interface card is simulated in a circuit simulation program running on host computer 930. Circuit simulation does not operate at the full network speed the network interface card is intended. Host computer 930 runs the interface program "Molasses" concurrently with the circuit simulation program. Host computer 930 connects to conventional computer network 924 (e.g., 10BaseT Ethernet over twisted pair) using a conventional network interface. Workstation 920 communicates with host computer 930 over computer network 924 using conventional network protocols. Host computer 930 can be, for example, a desktop PC running Windows 95 or Windows 98 and equipped with a 10baseT Ethernet controller card. In one embodiment, host computer 930 includes an Intel Pentium class processor and is equipped with 32 Mbytes of DRAM and 500 Mbytes of hard disk space. Host computer 930 also includes Media Access Controller ("MAC") drivers, parallel port drivers and the NDIS API (Network Driver Interface Specification—Application Program Interface). MAC drivers interface the operating system to the Ethernet card hardware. The NDIS API allows functional enhancements to network drivers in the operating system. A programming language interface (PLI) supported by the circuit simulation program allows the circuit simulation program to interact with the Molasses software. Workstation 920 can each be any conventional workstation, including a PC running the Windows 98 operating system.

Figure 7:
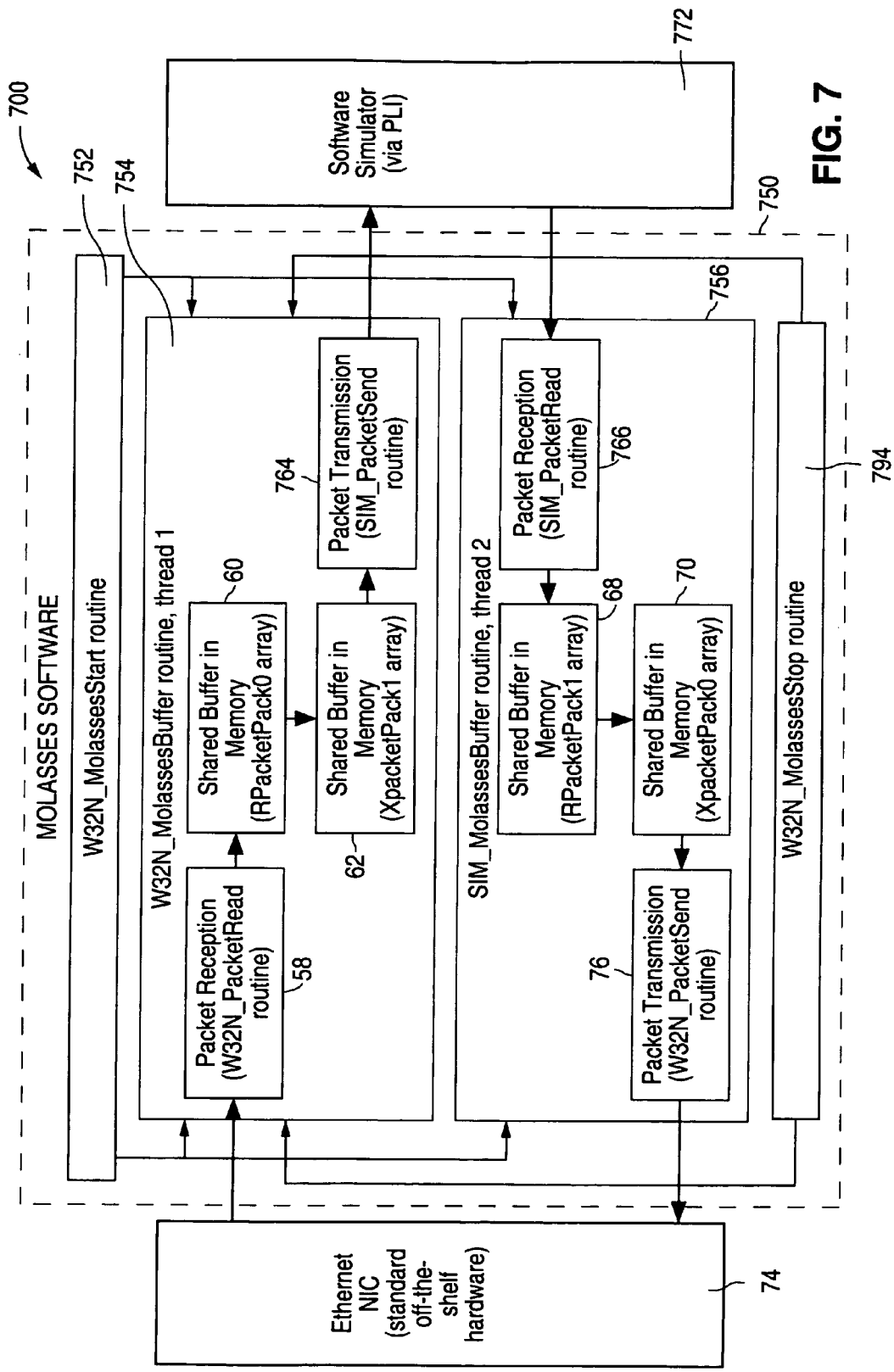
FIG. 7 is a block diagram 700 showing the functions performed by Molasses program 750, in accordance with a third embodiment of the present invention.

FIG. 7 is a block diagram 700 showing the functions performed by Molasses program 750, in accordance with a third embodiment of the present invention that can be implemented in the configuration of FIG. 9 Molasses program 750 can include a graphical user interface similar to that illustrated in FIG. 4 by Mainscreen 80. As in Molasses program 50, Molasses program 750 interfaces with network interface card (NIC) 74, which provides host computer 930's access to computer network 24, and simulation interface 772, which provides a program interface in host computer 930 to a circuit simulation running on host computer 930 concurrently with Molasses program 50. In this embodiment, simulation interface 772 can be a conventional programming language interface (PLI), an interprocess communication mechanism (e.g., a socket), a client-server type interface, or any other suitable software interface. For example, hardware description languages, such as Verilog or VHDL, provide support for programming interfaces. In particular, under Verilog, which is standardized by the Institute of Electrical and Electronics Engineers (IEEE), defines a PLI interface through which a compiled C Language program can communicate with a running circuit simulation.

Once the parameters of Mainscreen 80 are set, Mainscreen 80 calls "W32N_MolassesStart" routine 752. Routine 752 creates simultaneous threads running "W32N_MolassesBuffer" routine 754 and "SIM_Molasses-Buffer" routine 756, respectively. As in W32N_MolassesBuffer routine 54 discussed above, W32N_MolassesBuffer routine 754 receives packets from the Ethernet NIC 74 (via the same W32N_PacketRead routine 58 discussed above), stores the received packets into receive buffer 60 in host computer 930's main memory. Subsequently, the received packets in buffer 60 are transferred to transmit buffer 62, from which they are then transmitted to simulation PLI 772 via "SIM_PacketSend" routine 764. SIM_MolassesBuffer routine 756 receives packets from simulation PLI 772 (via "SIM_PacketRead" routine 766), stores the packets into receive buffer 68. Subsequently, routine 56 then transfers the data packets in buffer 68 to a transmit buffer 70, which are then transmitted to the Ethernet NIC 74 via "W32N_PacketSend" routine 76. As in Molasses program 50 above, Molasses program 750 converts data packet formats, when necessary. For example, the preamble that is used in a packet for synchronizing the clock signals of the network and the emulated device is removed before being forwarded to the circuit simulation over simulation PLI 772.

Mainscreen 80 calls "W32N_MolassesStop" routine 794 to terminate execution of both threads 754 and 756.

Figure 8:
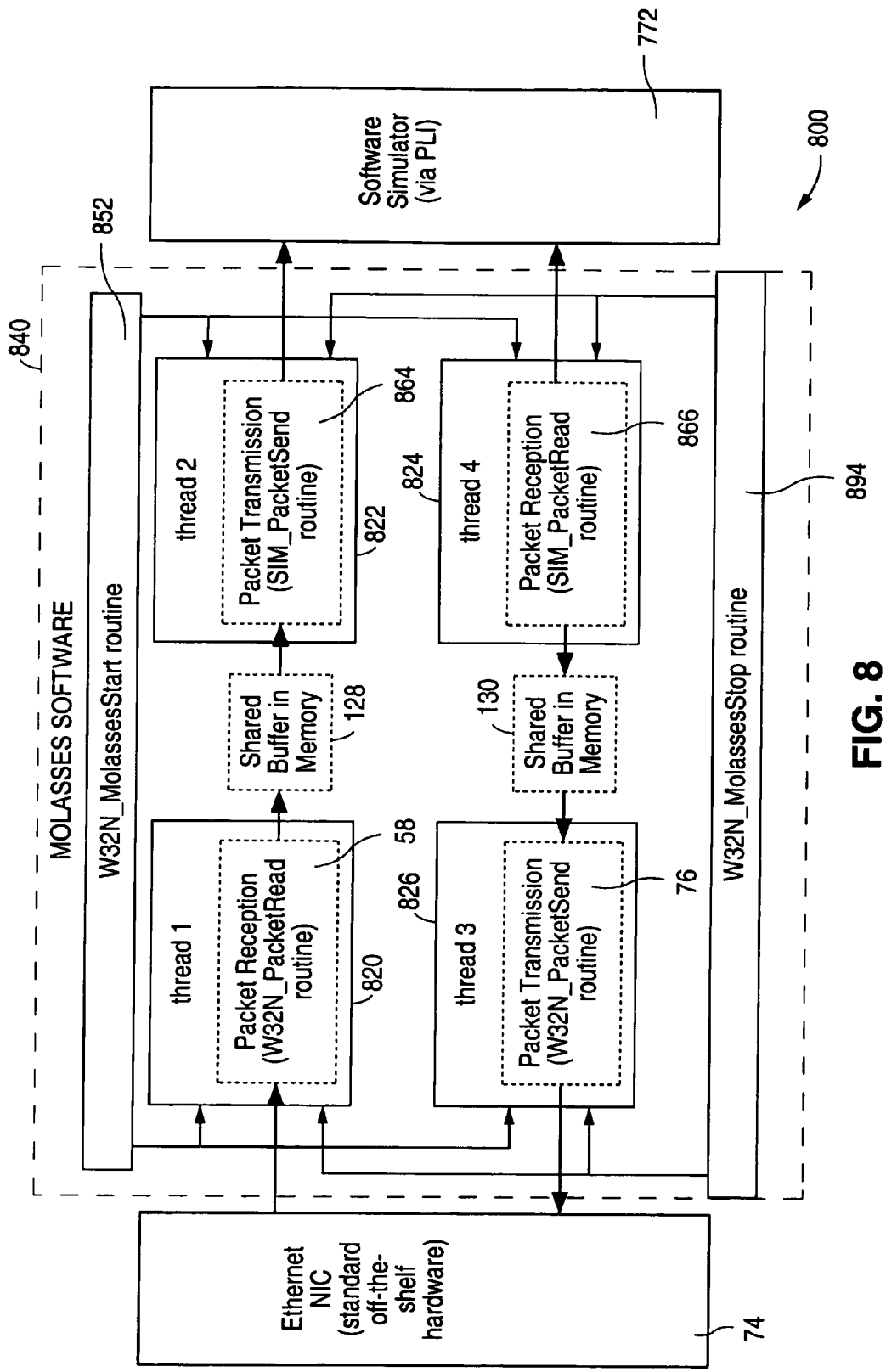
FIG. 8 is a block diagram 800 showing the functions performed by Molasses program 850, in accordance with a fourth embodiment of the present invention.

FIG. 8 is a block diagram 800 showing the functions performed by Molasses program 840, in accordance with a fourth embodiment of the present invention that can also be implemented in the configuration of FIG. 9. As in Molasses program 750 of FIG. 7, Molasses program 840 of FIG. 8 interfaces with network interface 74, which provides host computer 930's access to computer network 24, and simulation PLI 772, which couples host computer 930 to the running circuit simulation. Once the parameters of Mainscreen 80 (FIG. 4) are set, Mainscreen 80 calls "W32N_MolassesStart" routine 852, which creates four threads 820, 822, 824 and 826. Thread 820 executes "W32_PacketRead" routine 58, which receives data packets from Ethernet NIC 74 and stores the received data packet into shared buffer 128 in the main memory of the host computer 930. Thread 822 executes "SIM_PacketSend" routine 864, which polls shared buffer 128 for the received data packets, repackages these data packets and sends them to the running circuit simulation over simulation PLI 772. Thread 824 executes "SIM_PacketRead" routine 866, which receives data packets from the running circuit simulation over simulation PLI 772 and stores the received data packet into shared buffer 130. Thread 826 executes a "W32N_PacketSend" routine 76, which polls shared buffer 130 for data packets, repackages the data packets and sends them into network 24 over Ethernet NIC 74.

As in circuit emulator 12, because a circuit simulation typically runs at a speed much slower than devices on network 24, an alternative embodiment combines threads 824 and 826 and eliminates shared buffer 130, taking advantage that W32N_PacketSend routine 76 can complete repackaging and sending out a data packet to network 24 before arrival of the next data packet from the circuit simulation emulator 12 over simulation PLI 772.

Mainscreen 80 calls "W32N_MolassesStop" routine 894 to terminate execution of threads 820, 822, 824 and 826.

Figure 5:
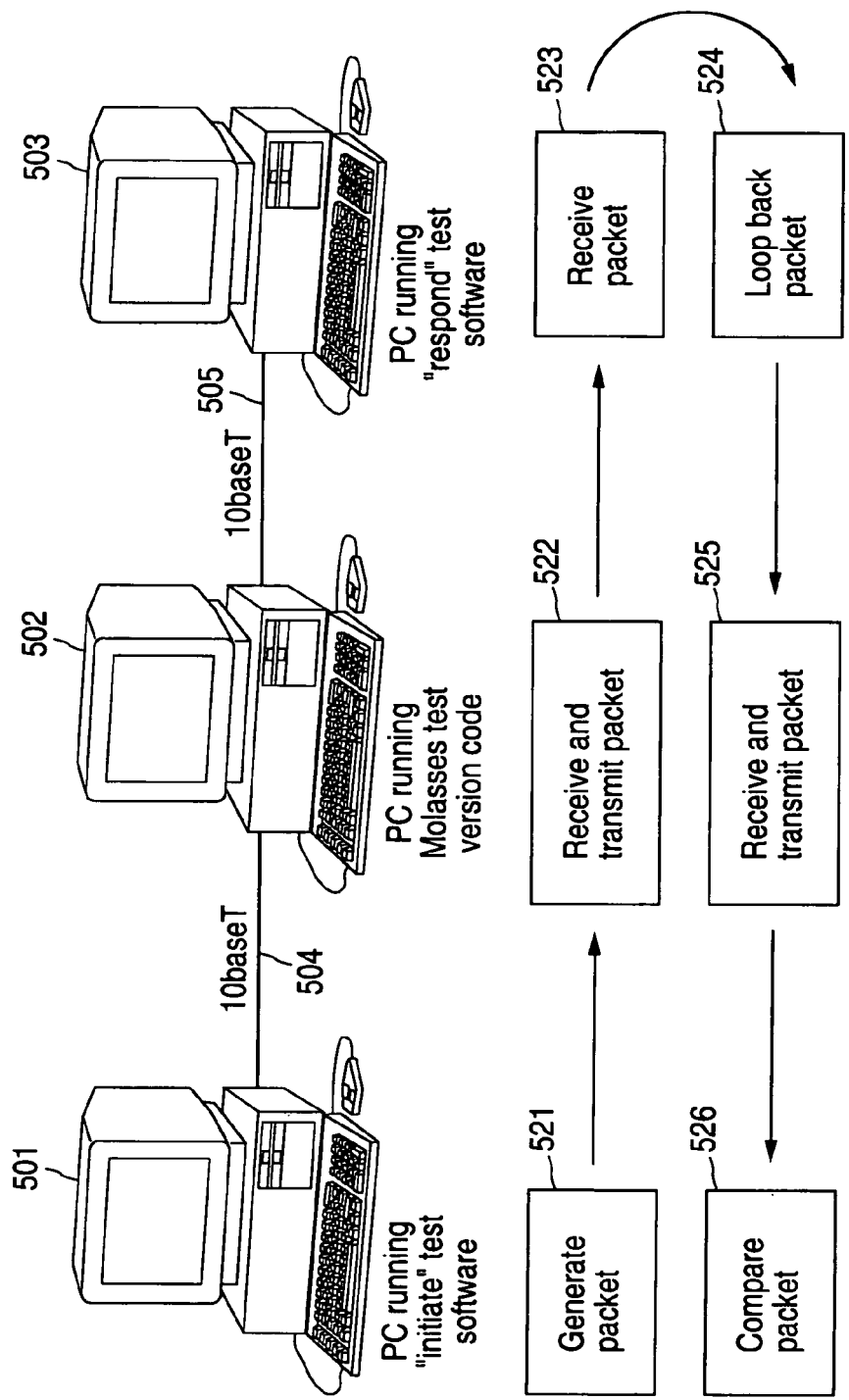
FIG. 5 shows a test setup suitable for a self-test in Molasses program 50, involving three personal computers (PC)

Molasses programs 50, 40, 750 and 840 each include a test program for self-test. FIG. 5 shows a test setup suitable for use with the self-test involving PCs 501, 502 and 503. For brevity, this test program is described with respect to Molasses program 50. Description herein regarding Molasses program 50 is equally applicable to Molasses program 40. The test program has two modes of operation—"initiate" and "respond". PC 502 runs Molasses program 50, configured to address two Ethernet network interface cards, rather than the bi-directional interface, as in FIG. 1. PC 501 runs the test software in initiate mode, generating and sending Ethernet packets of varying size to PC 502 via local area network 504 (e.g., Ethernet with 10BaseT connections) at step 521. At step 522, Molasses program 50 of PC 502 receives the packets from PC 501 using one of its two network interface cards, and then forwards the received packets to PC 503 over network 505, which is coupled to the other one of its network interface cards. PC 503 runs the test software in respond mode, taking each packet received from PC 502 (step 523) and re-transmitting it back to PC 502 over local area network 505 (step 524). At step 525, Molasses software of PC 502 then forwards the received packet from PC 503 to PC 501 over local area network 504. There, at step 526, under initiate mode, the test software on PC 501 compares the returned packet to the packet it transmitted at step 521. Any mismatch of these packets is reported as an error. In one embodiment, a timer can be set in $1/18$-second increments to specify the frequency of packet generation in PC 102.

A user interface is provided by the test program to self-test Molasses program 50. The user interface displays an appropriate amount of information, based on a user's selection of silent mode or verbose mode. Through this user interface, a user can vary a packet throughput rate, effectuate an overflow condition in any of buffers 60, 62, 68, 70, 128 and 130, or test for timing and throughput problems. A status line is provided in the user interface to continuously update information about packets processed by Molasses program 50, such as the number of packets sent and received, the current value of the timer, an error count, and other status information desired. In addition, a log file can be specified to record the value of each byte of each packet, errors that occurred, and comments that the user may wish to add using a comment line in the user interface. The recorded information may be used for future reference and debugging.

The test program also provides a test for accessing circuit emulator 12 through a bi-directional interface (e.g., a parallel port). In one embodiment, an industry standard parallel port conforming to the enhanced parallel port (EPP) standard is provided. The test program allows a user to read and write 8-bit addresses and 8-bit data patterns via the parallel port to circuit emulator 12. In one test, data is continuously written to and read back from circuit emulator 12 and compared. Any mismatch between the written data and the read back data is reported as an error.

Various modifications and adaptations of the operations described here would be apparent to those skilled in the art based on the above disclosure. Many variations and modifications within the scope of the present invention are therefore possible. The present invention is set forth by the following claims.

I claim:

1. A computer system, comprising:
   at least one processor; and
   a memory;
   wherein the computer system is configured to couple to an emulator and a peripheral device, wherein the emulator is configured to emulate an integrated circuit designed to communicate bidirectionally with the peripheral device;
   wherein the memory has computer instructions stored thereon that are executable by the at least one processor to cause the computer system to:

receive one or more digital data packets at a first transmission rate from the peripheral device via a first peripheral interface coupled to the computer system and to the peripheral device;
store the digital data packets in a memory buffer;
retrieve the digital data packets from the memory buffer; and
send data contained in the received digital data packets to the emulator at a second transmission rate over a second peripheral interface coupled to the computer system and to the emulator, wherein the second transmission rate is slower than the first transmission rate.

2. The computer system of claim 1, wherein the peripheral device is a network interface device;
wherein the emulator is configured to emulate an integrated circuit designed to communicate bidirectionally with the network interface device according to one or more network communication protocols; and
wherein the network interface device is configured to communicate according to the one or more network communication protocols.

3. The computer system of claim 2, wherein the peripheral device is a network interface card; and
wherein the instructions are executable as a multi-threaded program.

4. The computer system of claim 1, wherein the emulator is incapable of receiving and processing data sent to the emulator at the first transmission rate.

5. The computer system of claim 2, wherein the emulator is implemented, at least in part, using field programmable gate arrays; and
wherein the field programmable gate arrays are operable to be programmed with a hardware model corresponding to a design of the integrated circuit, wherein the design allows bidirectional communication with the peripheral device.

6. The system of claim 1, wherein the first and second peripheral interfaces are network connections; and
wherein the instructions are executable to cause the computer system to repackage data from the stored digital data packets.

7. The system of claim 2, wherein the instructions are executable to cause the computer system to modify data in the received one or more digital data packets to a data format accepted by the emulator.

8. The computer system of claim 2, wherein the received one or more digital data packets are variable in size.

9. A method, comprising:
a first computer receiving a plurality of data packets at a first transmission rate from a first peripheral device via a first interface, wherein the computer includes at least one processor and a memory;
the first computer buffering one or more of the plurality of data packets in the memory, wherein the buffered one or more packets are destined for an emulator coupled to the first computer via a second interface, wherein the emulator is configured to emulate a design of an integrated circuit used as a component of a second peripheral device, and wherein the integrated circuit is designed to communicate bidirectionally with the first peripheral device; and
the first computer sending data contained in the buffered one or more packets to the emulator via the second interface at a second transmission rate that is slower than the first transmission rate.

10. The method of claim 9, wherein the first and second interfaces are network connections.

11. The method of claim 9, further comprising:
the first computer repackaging data from the buffered data packets;
wherein the repackaged data is the data sent from the first computer to the emulator.

12. The method of claim 9, further comprising:
the emulator receiving and processing the data sent by the first computer, wherein said processing is performed, at least in part, according to the design of the integrated circuit.

13. The method of claim 12, further comprising the emulator sending data corresponding to the received and processed data to a second computer.

14. The method of claim 9, wherein the emulator is configured to emulate a network interface card, wherein the integrated circuit is designed to be a component of the network interface card; and
wherein the first transmission rate is a data rate of an ethernet network.

15. The method of claim 9, further comprising the first computer, for each data packet received:
examining that data packet;
determining if that data packet is addressed to the emulator, wherein the emulator is configured to emulate a network interface card; and
if that data packet is addressed to the emulator, buffering that data packet and sending data contained in the buffered packet to the emulator at the second transmission rate.

16. The method of claim 9, wherein the first and second peripheral devices are network interface devices;
wherein the emulator is configured to emulate an integrated circuit designed to communicate bidirectionally with the first network interface device according to one or more network communication protocols; and
wherein the second network interface device is configured to communicate according to the one or more network communication protocols.

17. A computer-readable storage medium having instructions stored thereon that are executable by at least one processor to cause a computer system including the at least one processor to perform operations comprising:
receiving, at a first transmission rate, one or more digital data packets sent from a peripheral device via a first peripheral interface;
buffering the received digital data packets within a memory of the computer system; and
at a second transmission rate that is slower than the first transmission rate, sending data contained in the buffered digital data packets to an emulator that is coupled to the computer system via a second peripheral interface, wherein the emulator is configured to receive and process the sent data according to a design of an integrated circuit being emulated, wherein the integrated circuit is designed to communicate bidirectionally with the peripheral device.

18. The computer-readable medium of claim 17, wherein the operations further include, for each digital data packet received by the computer system:
examining that digital data packet;
determining if that digital data packet is addressed to the emulator; and buffering that digital data packet and sending data contained in that buffered packet to the emulator only if that digital data packet is addressed to the emulator.

19. The computer-readable medium of claim 17,
wherein the peripheral device is a network interface device; and
wherein the integrated circuit is designed to communicate bidirectionally with the network interface device according to one or more network communication protocols via which the network interface device is also configured to communicate.

20. The computer-readable medium of claim 17, wherein the operations further include repackaging the data contained in the buffered data packets prior to sending the data to the emulator at the second transmission rate.

21. The computer-readable medium of claim 17, wherein the emulator is configured to receive and process data sent at the second transmission rate, but is not configured to receive and process data sent at the first transmission rate.

22. The computer-readable medium of claim 17, wherein the peripheral device is coupled to a different computer system, wherein the different computer system is configured to send data from the peripheral device via the first peripheral interface.

23. A method comprising:
receiving digital data at a program running on at least one processor of a computer, wherein the digital data is received at a first transmission rate from a circuit emulator via a first peripheral interface, and wherein the circuit emulator is configured to emulate an integrated circuit that is designed to communicate bidirectionally with a peripheral device;
storing the received data in a memory of the computer, wherein said storing is performed by the program;
retrieving the stored data from the memory, wherein said retrieving is performed by the program; and
transmitting the retrieved data to the peripheral device at a second transmission rate over a second peripheral interface coupled to the computer, wherein the first transmission rate is slower than the second transmission rate, and wherein said transmitting is performed by the program.

24. The method of claim 23, wherein the circuit emulator is incapable of receiving and processing data transmitted to the circuit emulator at the second transmission rate.

25. The method of claim 23, wherein the peripheral device is a network interface device, wherein the integrated circuit is designed to communicate bidirectionally with the network interface device using one or more network protocols that the network interface device is also configured to use.

26. The method of claim 23 further comprising modifying the received data from the circuit emulator to a data format accepted by the peripheral device, wherein said modifying is performed by the program.

27. The method of claim 23, wherein said receiving data from the circuit emulator is executed in a first thread, and said transmitting the data received from the circuit emulator is executed in a second thread.

28. A computer system, comprising:
at least one processor; and
a memory having computer instructions stored thereon that are executable by the at least one processor to cause the computer system to perform operations including:
receiving digital data from a circuit emulator at a first transmission rate via a first peripheral interface coupled to the computer system, wherein the circuit emulator is configured to emulate an integrated circuit that is designed to communicate bidirectionally with a peripheral device;
storing the received data within the computer system;
retrieving the stored data from within the computer system; and
transmitting the retrieved data to the peripheral device at a second transmission rate over a second peripheral interface coupled to the computer system, wherein the first transmission rate is slower than the second transmission rate.

29. The computer system of claim 28, wherein the circuit emulator is incapable of receiving and processing data transmitted to the circuit emulator at the second transmission rate.

30. The computer system of claim 28, wherein the operations further include modifying the received data from the circuit emulator to a data format accepted by the peripheral device.

31. The computer system of claim 28, wherein the operations further include keeping a record of the data transmitted to the peripheral device.

32. The computer system of claim 28, wherein the peripheral device is a network interface device, and wherein the integrated circuit is designed to communicate bidirectionally with the network interface device using one or more network protocols that the network interface device is also configured to use.

33. A non-transitory computer-readable medium having stored thereon computer instructions that are executable by a computing device to cause the computing device to perform operations comprising:
receiving digital data from a circuit emulator at a first transmission rate via a first peripheral interface, wherein the circuit emulator is configured to emulate an integrated circuit that is designed to communicate bidirectionally with a peripheral device;
storing the received data in a memory of the computing device;
retrieving the stored data from the memory; and
transmitting the retrieved data at a second transmission rate to the peripheral device over a second peripheral interface coupled to the computing device, wherein the first transmission rate is slower than the second transmission rate.

34. The non-transitory computer-readable medium of claim 33, wherein the second transmission rate exceeds a transmission rate at which the circuit emulator is capable of receiving and processing data transmitted to the circuit emulator.

35. The non-transitory computer-readable medium of claim 33, wherein the operations further include modifying the received data to a data format accepted by the peripheral device.

36. The non-transitory computer-readable medium of claim 33, wherein the operations further include keeping a record of the data received from the circuit emulator and the data transmitted to the peripheral device, wherein the received data and the transmitted data are usable to optimize and/or debug a design of the integrated circuit.

37. The non-transitory computer-readable medium of claim 33, wherein the peripheral device is a network interface device, and wherein the integrated circuit is designed to communicate bidirectionally with the network interface device using one or more network protocols that the network interface device is also configured to use.

* * * * *

UNITED STATES PATENT AND TRADEMARK OFFICE
CERTIFICATE OF CORRECTION

PATENT NO. : 8,160,863 B2  
APPLICATION NO. : 10/044217  
DATED : April 17, 2012  
INVENTOR(S) : Zeidman Page 1 of 2

It is certified that error appears in the above-identified patent and that said Letters Patent is hereby corrected as shown below:

On the Title Page, in Item (56), under "OTHER PUBLICATIONS", in Column 2, Line 1, delete "Elsanadidi" and insert -- Elsanadidi, --, therefor.

On the Title Page, in Item (56), under "OTHER PUBLICATIONS", in Column 2, Line 2, delete "Broadcast ACM," and insert -- Broadcast-ACM, --, therefor.

On Title Page 2, in Item (56), under "OTHER PUBLICATIONS", in Column 2, Line 1, delete "Larkshman the" and insert -- Larkshman, The --, therefor.

On Title Page 2, in Item (56), under "OTHER PUBLICATIONS", in Column 2, Line 2, delete "Procducts and Random Loss" and insert -- Products and Random Loss, --, therefor.

On Title Page 2, in Item (56), under "OTHER PUBLICATIONS", in Column 2, Line 3, delete "Networking" and insert -- Networking, --, therefor.

On Title Page 2, in Item (56), under "OTHER PUBLICATIONS", in Column 2, Line 6, delete "Kaye" and insert -- Kaye, --, therefor.

On Title Page 2, in Item (56), under "OTHER PUBLICATIONS", in Column 2, Line 9, delete "Mukherjee" and insert -- Mukherjee, --, therefor.

On Title Page 2, in Item (56), under "OTHER PUBLICATIONS", in Column 2, Line 13, delete "Lee" and insert -- Lee, --, therefor.

On Title Page 3, in Item (56), under "OTHER PUBLICATIONS", in Column 2, Line 26, delete "pages." and insert -- pages, --, therefor.

Signed and Sealed this  
Eighteenth Day of September, 2012

David J. Kappos  
*Director of the United States Patent and Trademark Office*

In Fig. 6, Drawing Sheet 5 of 8, for Tag "52", in Line 1, delete "W32N MolassesStart" and insert -- W32N_MolassesStart --, therefor.

In Column 3, Line 35, delete "(PC)" and insert -- (PC). --, therefor.

In Column 9, Line 39, in Claim 6, delete "system" and insert -- computer system --, therefor.

In Column 9, Line 44, in Claim 7, delete "system" and insert -- computer system --, therefor.